United States Patent
Johnson

(10) Patent No.: US 7,447,493 B2
(45) Date of Patent: *Nov. 4, 2008

(54) TUNER SUITABLE FOR INTEGRATION AND METHOD FOR TUNING A RADIO FREQUENCY SIGNAL

(75) Inventor: Richard A. Johnson, Buda, TX (US)

(73) Assignee: Silicon Laboratories, Inc., Austin, TX (US)

( * ) Notice: Subject to any disclaimer, the term of this patent is extended or adjusted under 35 U.S.C. 154(b) by 419 days.

This patent is subject to a terminal disclaimer.

(21) Appl. No.: 10/377,573

(22) Filed: Feb. 28, 2003

(65) Prior Publication Data

US 2004/0169773 A1   Sep. 2, 2004

(51) Int. Cl.
H04B 1/16 (2006.01)
H04B 1/18 (2006.01)
H03D 1/00 (2006.01)
H04N 5/44 (2006.01)

(52) U.S. Cl. .............. 455/334; 455/150.1; 455/183.1; 455/189.1; 455/190.1; 455/76; 375/339; 348/725; 348/726

(58) Field of Classification Search ............ 455/76, 455/77, 131, 150.1, 165.1, 173.1, 179.1–183.1, 455/188.1–199.1, 323, 324, 326, 20, 22; 375/132, 326, 339, 344; 348/725–735
See application file for complete search history.

(56) References Cited

U.S. PATENT DOCUMENTS

| | | | | | |
|---|---|---|---|---|---|
| 4,090,145 A | * | 5/1978 | Webb | ............ | 329/323 |
| 4,346,477 A | * | 8/1982 | Gordy | ............ | 455/257 |
| 4,361,906 A | | 11/1982 | Sakamoto | | |
| 4,464,770 A | * | 8/1984 | Maurer et al. | ............ | 375/373 |
| 4,626,803 A | * | 12/1986 | Holm | ............ | 332/151 |
| 4,653,117 A | * | 3/1987 | Heck | ............ | 455/209 |
| 4,803,700 A | * | 2/1989 | Dewey et al. | ............ | 375/321 |
| 4,817,167 A | * | 3/1989 | Gassmann | ............ | 381/3 |
| 4,866,261 A | | 9/1989 | Pace | | |
| 4,893,316 A | * | 1/1990 | Janc et al. | ............ | 708/300 |
| 4,926,130 A | * | 5/1990 | Weaver | ............ | 327/105 |

(Continued)

FOREIGN PATENT DOCUMENTS

WO  WO 87/01531   3/1987

OTHER PUBLICATIONS

"A GSM/GPRS Mixed Signal Baseband IC," Redmond, David. et al., IEEE Int'l. Solid State Circuits Conference (ISSCC), Digest of Technical Papers, XP010585465, Feb. 2002, Sec. 3.6.

(Continued)

*Primary Examiner*—Duc M Nguyen
(74) *Attorney, Agent, or Firm*—Larson Newman Abel Polansky & White, LLP

(57) ABSTRACT

A tuner (200) includes a direct digital frequency synthesizer (206) and a mixer (220). The direct digital frequency synthesizer (206) has an output terminal for providing a digital local oscillator signal having a frequency chosen to mix a desired channel to baseband. The mixer (220) has a first input terminal for receiving a tuned radio frequency signal, a second input terminal coupled to the output terminal of the direct digital frequency synthesizer (206), and an output terminal for providing an in-phase baseband signal.

37 Claims, 5 Drawing Sheets

U.S. PATENT DOCUMENTS

| | | | |
|---|---|---|---|
| 4,944,025 A * | 7/1990 | Gehring et al. | 455/207 |
| 4,975,699 A * | 12/1990 | Frey | 341/118 |
| 5,251,218 A * | 10/1993 | Stone et al. | 370/343 |
| 5,263,194 A * | 11/1993 | Ragan | 455/316 |
| 5,331,293 A * | 7/1994 | Shepherd et al. | 331/1 R |
| 5,425,057 A * | 6/1995 | Paff | 375/326 |
| 5,428,824 A | 6/1995 | Kasai | |
| 5,440,587 A * | 8/1995 | Ishikawa et al. | 375/332 |
| 5,442,352 A | 8/1995 | Jackson | |
| 5,495,512 A | 2/1996 | Kovacs et al. | |
| 5,544,200 A | 8/1996 | An | |
| 5,598,430 A | 1/1997 | Hachisuka et al. | |
| 5,640,698 A * | 6/1997 | Shen et al. | 455/323 |
| 5,701,598 A | 12/1997 | Atkinson | |
| 5,708,687 A | 1/1998 | Powell et al. | |
| 5,737,035 A | 4/1998 | Rotzoll | |
| 5,752,174 A | 5/1998 | Matai et al. | |
| 5,826,180 A | 10/1998 | Golan | |
| 5,828,955 A * | 10/1998 | Lipowski et al. | 455/324 |
| 5,867,535 A * | 2/1999 | Phillips et al. | 375/295 |
| 6,121,819 A * | 9/2000 | Traylor | 327/359 |
| 6,154,640 A * | 11/2000 | Itoh et al. | 455/76 |
| 6,172,569 B1 | 1/2001 | McCall et al. | |
| 6,177,964 B1 | 1/2001 | Birleson et al. | |
| 6,222,891 B1 | 4/2001 | Liu et al. | |
| 6,249,179 B1 * | 6/2001 | Maalej et al. | 329/304 |
| 6,263,195 B1 * | 7/2001 | Niu et al. | 455/150.1 |
| 6,278,391 B1 | 8/2001 | Walker | |
| 6,330,290 B1 | 12/2001 | Glas | |
| 6,377,315 B1 | 4/2002 | Carr et al. | |
| 6,504,498 B1 | 1/2003 | O'Brien | |
| 6,567,654 B1 | 5/2003 | Coronel Arredondo et al. | |
| 6,593,805 B2 * | 7/2003 | Kunieda et al. | 329/304 |
| 6,600,373 B1 | 7/2003 | Bailey et al. | |
| 6,639,534 B2 | 10/2003 | Khoini-Poorfard et al. | |
| 6,650,624 B1 | 11/2003 | Quigley et al. | |
| 6,694,131 B1 | 2/2004 | Lakkis | |
| 6,711,149 B1 | 3/2004 | Yano et al. | |
| 6,727,936 B2 | 4/2004 | Liu et al. | |
| 6,778,117 B1 * | 8/2004 | Johnson | 341/144 |
| 6,785,529 B2 | 8/2004 | Ciccarelli et al. | |
| 6,799,020 B1 * | 9/2004 | Heidmann et al. | 455/103 |
| 6,829,311 B1 * | 12/2004 | Riley | 375/326 |
| 6,867,693 B1 * | 3/2005 | Radin | 340/539.13 |
| 6,876,839 B2 | 4/2005 | Harris | |
| 6,950,047 B1 | 9/2005 | Piasecki et al. | |
| 6,961,314 B1 | 11/2005 | Quigley et al. | |
| 6,963,734 B2 * | 11/2005 | Sorrells et al. | 455/296 |
| 6,965,616 B1 | 11/2005 | Quigley et al. | |
| 7,023,868 B2 | 4/2006 | Rabenko et al. | |
| 7,027,528 B2 | 4/2006 | Liu et al. | |
| 7,035,595 B1 | 4/2006 | Kim et al. | |
| 7,079,195 B1 | 7/2006 | Birleson et al. | |
| 7,103,065 B1 | 9/2006 | Quigley et al. | |
| 7,124,153 B2 * | 10/2006 | Grushin | 708/103 |
| 7,139,329 B2 | 11/2006 | Takahiko | |
| 7,183,958 B2 | 2/2007 | Quilligan et al. | |
| 7,199,740 B1 | 4/2007 | Ferguson et al. | |
| 7,227,438 B2 | 6/2007 | Song et al. | |
| 7,236,212 B2 | 6/2007 | Carr et al. | |
| 7,239,357 B2 | 7/2007 | Jaffe | |
| 7,254,190 B2 | 8/2007 | Kwentus et al. | |
| 2001/0041532 A1 | 11/2001 | Tomasz et al. | |
| 2002/0168951 A1 | 11/2002 | Paulus et al. | |
| 2002/0177423 A1 | 11/2002 | Cowley | |
| 2003/0007377 A1 * | 1/2003 | Otaka | 363/127 |
| 2003/0083033 A1 | 5/2003 | Staszewski | |
| 2003/0112893 A1 | 6/2003 | Lee et al. | |
| 2003/0199264 A1 | 10/2003 | Holenstein et al. | |
| 2003/0223525 A1 | 12/2003 | Momtaz et al. | |
| 2004/0002318 A1 | 1/2004 | Kerth et al. | |
| 2005/0142040 A1 | 6/2005 | Hanawa et al. | |
| 2005/0239499 A1 | 10/2005 | Oosawa et al. | |
| 2006/0083320 A1 | 4/2006 | Feher | |
| 2006/0141973 A1 | 6/2006 | Behrens et al. | |
| 2007/0085719 A1 | 4/2007 | Maxim et al. | |

OTHER PUBLICATIONS

"Optimized Digital Signal Processing for Flexible Receivers," Brückmann, Dieter et al., IEEE Int'l (ICASSP), XP010804418, 2002, pp. IV—3765-3766.

Sony Product Listing, "CXA3250AN: All Band TV Tuner IC with On-Chip PLL" Datasheet.

* cited by examiner

TUNER SUITABLE FOR INTEGRATION AND METHOD FOR TUNING A RADIO FREQUENCY SIGNAL

CROSS REFERENCE TO RELATED, COPENDING APPLICATION

Related subject matter is found in a copending patent application entitled "Local Oscillator and Mixer for a Radio Frequency Receiver and Related Methods," application number unknown, invented by Richard A. Johnson, filed of even date herewith and assigned to the assignee hereof.

FIELD OF THE INVENTION

The present invention relates generally to television receivers, and more particularly to television tuners suitable for integration onto a silicon chip.

BACKGROUND OF THE INVENTION

The majority of television tuners used today are discrete single conversion tuners. FIG. 1 illustrates in partial block diagram and partial schematic form such a discrete single conversion television tuner 20 known in the prior art. Television tuner 20 has an input for receiving a radio frequency (RF) signal labeled "RF INPUT" from an antenna or cable source (not shown) having channels in the range of 48 megahertz (MHz) to 870 MHz. A tracking bandpass filter 22 receives the RF INPUT signal and attenuates undesired channel energy to provide a filtered signal to an input of a low noise amplifier labeled "LNA" 24. An RF synthesizer 28 controls a variable local oscillator (LO) 30 to provide a mixing signal in the range of 95 to 911 MHz. The mixing signal is combined with the output of LNA 24 in a mixer 26, which mixes the desired channel to an intermediate frequency (IF) of 44 MHz. The output of mixer 26 is amplified in a programmable gain amplifier (PGA) 32 and is filtered in an IF filter 34 having a center frequency at the conventional IF of 44 MHz and having a passband of 6 MHz. Thus IF filter 34 provides an output signal containing the desired channel and having frequency content primarily from 41 MHz to 47 MHz.

Discrete single conversion tuners such as tuner 20 suffer several disadvantages. Tuner 20 requires a large amount of circuit board space due to the large number of discrete components. It also requires RF expertise to lay out the circuit board to avoid undesirable signal cross coupling and interference. Tracking bandpass filter 22 needs manual calibration, increasing production cost. Also the performance of tuner 20 varies significantly over temperature.

It has long been thought that a silicon-based television tuner could be manufactured cheaper and with more stable performance than a discrete tuner and that silicon-based television tuners would ultimately replace discrete television tuners. Unfortunately, existing silicon-based television tuners do not perform as well as discrete tuners and have not become significant in the marketplace.

FIG. 2 illustrates one known existing silicon-based television tuner 40. Tuner 40 uses a so-called "up/down" or double conversion architecture. Tuner 40 includes an LNA 42, an up conversion mixer 44, an RF synthesizer 46, a local oscillator 48, a surface acoustic wave (SAW) filter 50, a PGA 52, a down conversion mixer 54, a local oscillator 56, and an IF filter 58. LNA 42 has an input for receiving the RF INPUT signal from an antenna or cable source (not shown), and an output. Up conversion mixer 44 has a first input connected to the output of LNA 42, a second input for receiving a signal labeled "LO1", and an output. RF synthesizer 46 has first and second outputs for respectively providing first and second control signals. Oscillator 48 has an input connected to the first output of RF synthesizer 46, and an output for providing signal LO1. SAW filter 50 has an input connected to the output of mixer 44, and an output. PGA 52 has an input connected to the output of SAW filter 50, and an output. Mixer 54 has a first input connected to the output of PGA 52, a second input for receiving a signal labeled "LO2", and an output. Oscillator 56 has an input connected to the second output of RF synthesizer 46, and an output connected to the second input of mixer 54. IF filter 58 has an input connected to the output of mixer 54, and an output for providing the IF OUTPUT signal with similar spectral characteristics as the output of tuner 20.

LNA 42 functions as a broadband amplifier and provides an amplified signal to mixer 44. Mixer 44 receives mixing signal LO1 from oscillator 48 at a frequency chosen to mix the selected channel to a frequency band centered around 1100 MHz, but mixes undesired channels as well. SAW filter 50 is an external filter that separates the desired channel, centered around 1100 MHz, from the unwanted channels. PGA 52 amplifies the output of SAW filter 50 to provide an output signal having uniform signal strength. Mixer 54 mixes the output of PGA 52 down to the desired IF frequency of 44 MHz using mixing signal LO2 at 1056 MHz provided by oscillator 56. IF filter 58 has a center frequency of 44 MHz and a passband of 6 MHz and attenuates unwanted channel information outside of this range.

While the up/down architecture of tuner 40 does not require manual calibration during manufacturing and is stable over temperature, it has many deficiencies that make its performance inferior to the discrete tuner illustrated in FIG. 1. Tuner 40 uses two high frequency oscillators. Because they are high frequency it is possible to implement them in silicon using inductor-capacitor (LC) oscillators. However LC-based oscillators have many drawbacks that reduce their desirability. First, they are susceptible to electric and magnetic interference which can create spurs (or tones) and noise and lower overall performance. Second, two oscillators which are close in frequency such as oscillators 48 and 56 used in tuner 40 tend to lock to one another. To avoid locking, there needs to be a lot of isolation between the two oscillators, which is difficult to achieve. Third, the first oscillator's range is nearly 100% of its frequency which means that the LC product must vary by about a 4:1 ratio to successfully tune over this range (since frequency is proportional to the square root of one over the LC product). However this range of values is difficult to achieve in silicon. Such an oscillator would usually be implemented as many selectable LC oscillators but this approach requires a lot of integrated circuit area. Fourth, having multiple LC oscillators adds phase noise which can degrade performance for digital television applications.

Another disadvantage relates to external SAW filter 50. SAW filter 50 is required because undesired channels need to be attenuated by a large amount and only SAW filters have the desired transfer characteristic at such high frequencies. However SAW filters are expensive. They need to be driven with a matched impedance, which increases power dissipation substantially. SAW filters are lossy. Also while SAW filters have good attenuation they have poor frequency selectivity and pass more than just the desired channel.

Another disadvantage relates to the mixing process in different signal environments. Cable television tuning requirements are very different from terrestrial television tuning requirements because of the difference in energy levels between a desired channel and undesired channels at adjacent frequencies. A cable head-end drives all channels with similar power levels and therefore a cable television tuner receives the desired and undesired channels at similar power levels. A terrestrial television receiver could be much closer to undesired channels' transmitters than to the desired channel's transmitter, leading to the undesired channels having much more signal energy than the desired channel. The tracking filter of tuner 20 helps filter the undesired channels. However since there is no tracking filter in tuner 40 and since SAW filter 50 passes more than the desired channel, mixers 44 and 54 see the large energy difference between the desired and the undesired channel.

This energy difference is very problematic since any spur or noise in the oscillator or non-linearity in the mixing process can mix the large undesired channel or channels into the desired channel and destroy the reception of the desired channel. The result is that tuner 40 has sufficient performance for some cable television applications, in which signal strength of all channels is nearly uniform, but poor performance as a terrestrial television tuner. Thus tuner 40 has failed to displace discrete tuner 20.

Thus it would be desirable to have a tuner architecture which is suitable for integration but which has performance comparable to or better than that of a discrete tuner. Such a tuner is provided by the present invention, whose features and characteristics will become apparent from the subsequent detailed description of the invention and the appended claims, taken in conjunction with the accompanying drawings and this background of the invention.

BRIEF SUMMARY OF THE INVENTION

Accordingly the present invention provides, in one form, a tuner including a direct digital frequency synthesizer and a mixer. The direct digital frequency synthesizer has an output terminal for providing a digital local oscillator signal having a frequency chosen to mix a desired channel to baseband. The mixer has a first input terminal for receiving a tuned radio frequency signal, a second input terminal coupled to the output terminal of the direct digital frequency synthesizer, and an output terminal for providing an in-phase baseband signal.

In another form the present invention provides a tuner including first and second mixers, means for processing, and an up-conversion mixer. The first mixer has a first input terminal for receiving a tuned radio frequency signal, a second input terminal for receiving a first digital local oscillator signal having a frequency chosen to mix a desired channel to baseband, and an output terminal for providing an in-phase baseband signal. The second mixer has a first input terminal for receiving the tuned radio frequency signal, a second input terminal for receiving a phase-shifted first digital local oscillator signal, and an output terminal for providing a quadrature baseband signal. The means for processing processes at least one of the in-phase baseband signal and the quadrature baseband signal at baseband to provide a processed in-phase signal and a processed quadrature signal. The up conversion mixer has a first input terminal for receiving the processed in-phase signal, a second input terminal for receiving the processed quadrature signal, a third input terminal for receiving a second digital local oscillator signal having a predetermined frequency, a fourth input terminal for receiving a phase-shifted second digital local oscillator signal, and an output terminal for providing a tuned intermediate frequency signal.

In yet another form, the present invention provides a method for tuning a signal. A digital local oscillator signal having a frequency chosen to mix a desired channel to baseband is generated. A tuned radio frequency signal is received and mixed with a digital local oscillator signal to provide an in-phase baseband signal.

In still another form the present invention provides a method for tuning a signal. A tuned radio frequency signal is received and mixed to baseband using a first digital local oscillator signal and a phase-shifted first digital local oscillator signal to form an in-phase baseband signal and a quadrature baseband signal, respectively. At least one of the in-phase baseband signal and the quadrature baseband signal are processed at baseband to form a processed in-phase signal and a processed quadrature signal. The processed in-phase signal and the processed quadrature signal are mixed to an intermediate frequency using a second digital local oscillator signal and a phase-shifted second digital local oscillator signal, respectively, to form first and second intermediate frequency signals. The first and second intermediate frequency signals are combined to form an intermediate frequency output signal.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the drawings.

Figure 3:
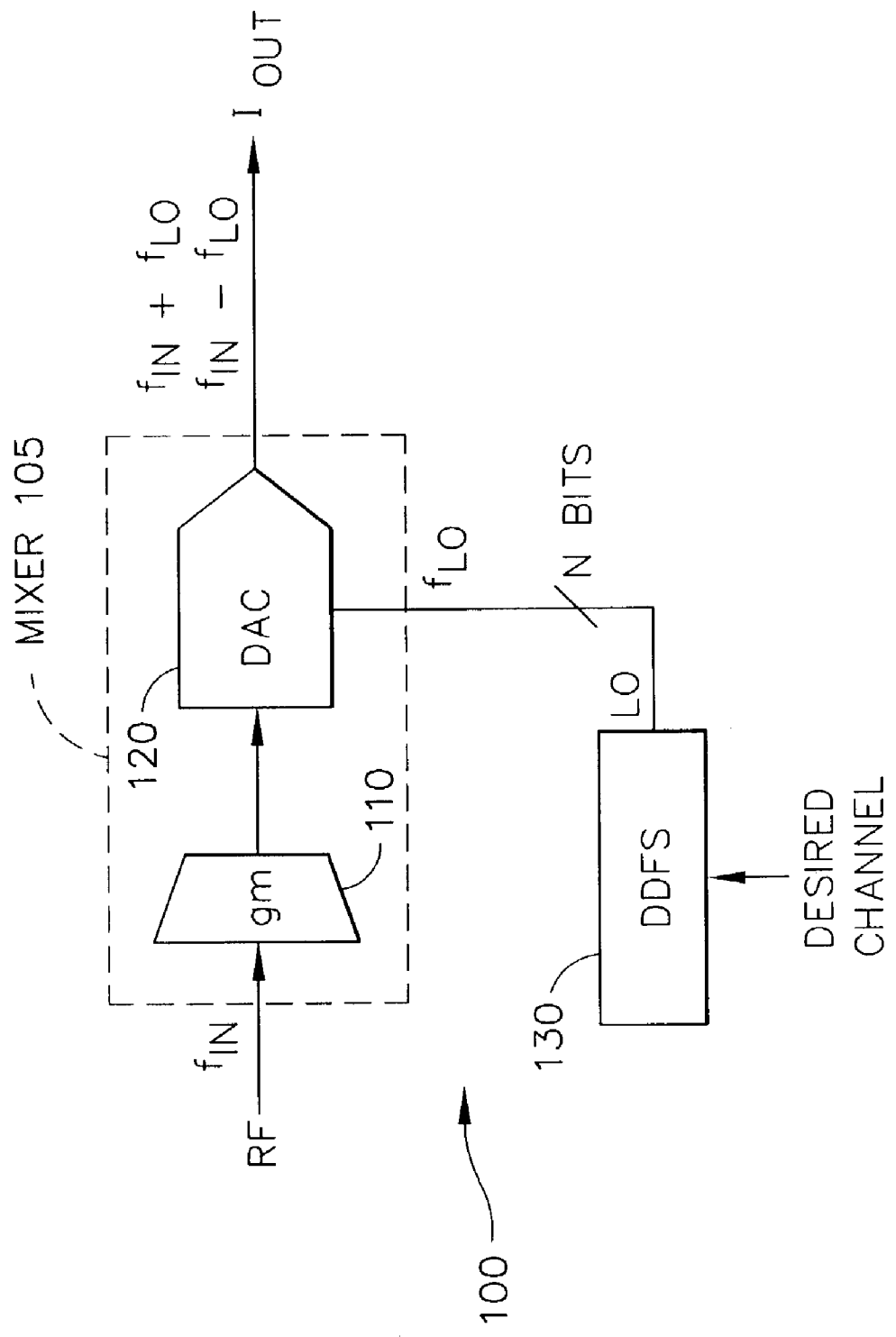
FIG. 3 illustrates in partial block diagram and partial schematic form a local oscillator and mixer circuit useful in a television tuner according to the present invention.

FIG. 3 illustrates in partial block diagram and partial schematic form a local oscillator and mixer circuit 100 useful in a television tuner according to the present invention. Circuit 100 includes a transconductance amplifier 110, a current multiplying DAC 120, and a DDFS 130. Transconductance amplifier 110 has an input terminal for receiving a radio frequency signal labeled "RF", and an output terminal for providing a current signal, and has an associated transconductance labeled "gm". As used herein, "radio frequency signal" means an electrical signal conveying useful information and having a frequency from about 3 kilohertz (kHz) to thousands of gigahertz (GHz), regardless of the medium through which such signal is conveyed. Thus an RF signal may be transmitted through air, free space, coaxial cable, fiber optic cable, etc. Signal RF has desired spectral content centered at a frequency $f_{IN}$. Current multiplying DAC 120 has a first input terminal connected to the output terminal of transconductance amplifier 110, a second input terminal, and an output terminal for providing an output signal labeled "$I_{OUT}$". DDFS 130 has an input terminal for receiving a tuning signal corresponding to a DESIRED CHANNEL, and an output terminal connected to the second input terminal of current multiplying DAC 120 for providing a digital local oscillator signal labeled "LO" represented by N bits. LO is a digital representation of voltages of a sine wave having a frequency $f_{LO}$.

In basic operation, transconductance amplifier 110 converts the RF signal from a voltage signal into a current signal. DAC 120 is a current multiplying DAC that receives the current signal at the output of transconductance amplifier 110, mixes it bit-by-bit with the N-bit mixing signal from DDFS 130, and sums the output current components to form $I_{OUT}$. As a result of the mixing operation $I_{OUT}$ moves the spectral content of RF to sum and difference frequencies, namely $f_{IN}+f_{LO}$ and $f_{IN}-f_{LO}$. DDFS 130 provides signal LO at a frequency chosen to mix the DESIRED CHANNEL to another frequency of interest, such as baseband or a suitable intermediate frequency (IF). Current multiplying DAC 120 includes multiple mixing cells each weighted according to the order of the cell.

Figure 4:
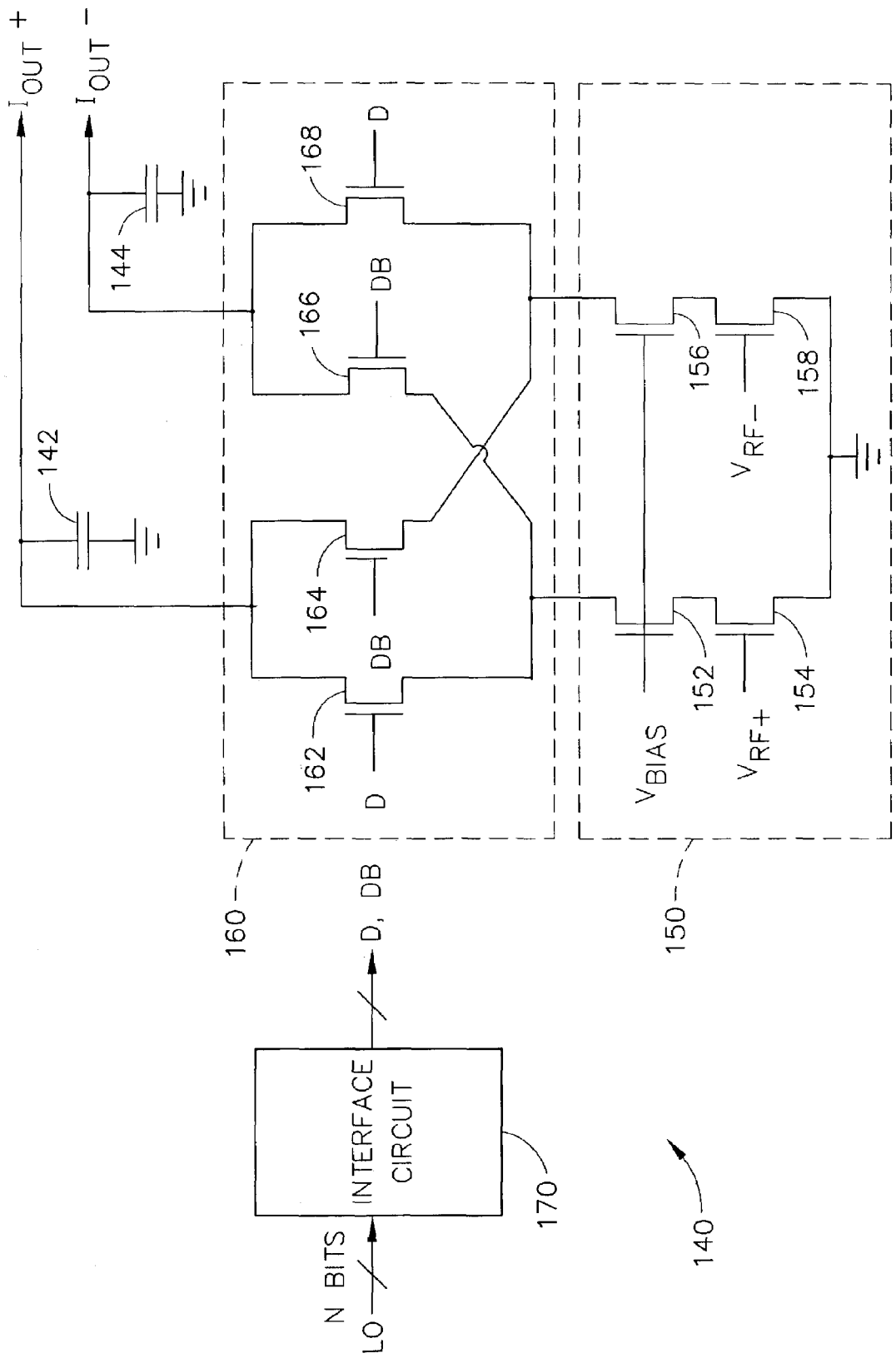
FIG. 4 illustrates in schematic form a circuit implementation of one cell of the mixer circuit of FIG. 3.

FIG. 4 illustrates in schematic form a circuit implementation of one cell 140 of mixer circuit 105 of FIG. 3. Cell 140 includes generally a current cell 150 of transconductance amplifier 110 and a converter cell 160 of DAC 120. Also shown in FIG. 3 are an interface circuit 170 of DAC 120, a load capacitor 142, and a load capacitor 144. Current cell 150 includes N-channel metal-oxide-semiconductor (MOS) transistors 152, 154, 156, and 158. Transistor 152 has a drain, a gate for receiving a bias voltage labeled "$V_{BIAS}$", and a source. Transistor 154 has a drain connected to the source of transistor 152, a gate for receiving a signal labeled "$V_{RF+}$", and a source connected to a ground power supply voltage terminal. Transistor 156 has a drain, a gate for receiving bias voltage $V_{BIAS}$, and a source. Transistor 158 has a drain connected to the source of transistor 156, a gate for receiving a signal labeled "$V_{RF-}$", and a source connected to the ground power supply voltage terminal.

Converter cell 160 includes transistors 162, 164, 166, and 168. Transistor 162 has a drain for providing signal $I_{OUT}^+$, a gate for receiving a true data signal labeled "D", and a source connected to the drain of transistor 132. Transistor 164 has a drain connected to the drain of transistor 162, a gate for receiving a complementary data signal labeled "DB", and a source connected to the drain of transistor 156. Transistor 166 has a drain for providing signal $I_{OUT-}$, a gate for receiving signal DB, and a source connected to the drain of transistor 152. Transistor, 168 has a drain connected to the drain of transistor 166, a gate for receiving signal D, and a source connected to the drain of transistor 156.

Interface circuit 170 is shared between all current cells in DAC 120 and has an input terminal for receiving the N-bit LO signal from DDFS 130, and an output terminal for providing a multiple bit output signal labeled "D, DB". D and DB are true and complement digital signals, respectively, of a digital signal pair corresponding to certain values of the N-bit LO signal as will be described further below, and interface circuit provides one pair for each converter cell.

Capacitor 142 has a first terminal connected to the drains of transistors 162 and 164, and a second terminal connected to the ground power supply voltage terminal. Capacitor 144 has a first terminal connected to the drains of transistors 166 and 168, and a second terminal connected to the ground power supply voltage terminal. Capacitors 142 and 144 serve as filter capacitors and are shared between all cells.

The RF input signal is represented as a differential voltage signal between $V_{RF+}$ and $V_{RF-}$. $V_{BIAS}$ is a bias voltage selected to keep transistors 154 and 158 operating in the triode (linear) region of their voltage-current characteristic. Thus as $V_{RF+}$ and $V_{RF-}$ vary, they modulate the voltage at the sources of transistors 152 and 156, forming a differential current signal on the drains of transistors 132 and 136. The bits of the digital local oscillator signal LO cause transistors 162, 164, 166, and 168 to switch the current of current cell 150 from side to side. These currents are switched at the output speed of DDFS 130, $f_{CLOCK}$, which is constrained by Nyquist's theorem to be greater than twice the maximum $f_{LO}$.

The resolution (and hence the number of bits) required by DAC 120 can be determined by considering the worst-case energy in the undesired channels, since quantization noise will be mixed by the undesired channels into the desired band at the output of the mixer. A terrestrial television receiver may need to tune a relatively-weak desired channel when the receiver is close to the transmitter of a relatively-strong undesired channel. For example assume the desired channel has a signal strength of −83 dBm (where dBm represents a decibel power level with reference to a power level of 1 milliwatt dissipated across a 75 ohm load), an undesired channel has a signal strength of −15 dBm, and the minimum signal to noise ratio (SNR) required at the output of the mixer is 15 dB. The integrated quantization noise for the LO signal in a 6 MHz band for a 10-bit DAC clocked at 2 gigahertz (2 GHz) is −84 dBc (decibel level with respect to carrier frequency $f_{LO}$). This quantization noise appears in every 6 MHz band from DC to $f_{CLOCK}/2$ (1 GHz) and is mixed by the −15 dBm undesired channel into the desired channel's band at a −99 dBm level (−15 dBm+(−84 dBc)). The resulting SNR is thus −83 dBm−(−99 dBm)=16 dB, which is greater than the minimum required SNR of 15 dB. Thus a 10-bit DAC yields barely acceptable results while a 9-bit DAC would not.

The switching speed of the DAC, which determines the maximum $f_{LO}$ which can be created because the clock of the DAC must be greater than twice the maximum $f_{LO}$, is determined by the on resistance of transistors 162, 164, 166, and 168 in FIG. 4 and the parasitic capacitances at the sources of the switches. There is a practical speed limit for this structure in a given technology because as the switch resistance is decreased the parasitic capacitance increases. However the practical speed limit is in the range of several GHz for existing integrated circuit technologies, which makes the DDFS/mixer combination suitable for a broad variety of radio frequency receiver applications.

Interface circuit 170 converts the N-bit LO signal into pairs of true and complementary bits so that converter cell 160 can switch the currents differentially. In one embodiment, each of the D and DB signals as well as the current and converter cells are binarily weighted; thus the most significant bit pairs switch currents that are twice the currents switched by the second most significant bit pairs, the second most significant bit pairs switch currents that are twice the currents switched by the third most significant bit pairs, and so on. In this case interface circuit 170 provides 2N output signals consisting of N pairs of D and DB signals.

Preferably to achieve better performance, however, the less significant bits are binarily weighted as just described while the more significant bits are thermometer encoded. In a thermometer encoding scheme, the binary values will be switched using a corresponding number of equally-weighted currents. Thus M thermometer encoded bits switch $2^M-1$ equally-weighted current cells. The number of most significant bits that are thermometer encoded will vary depending on the desired performance, and the number of output pairs generated by interface circuit 170 will also vary accordingly.

The output signal is also preferably a differential signal formed between $I_{OUT+}$ and $I_{OUT-}$. In an alternative embodiment, however, if the drains of transistors 166 and 168 were connected to a reference voltage terminal, such as an analog ground terminal, the drains of transistors 162 and 164 would form a single-ended output signal.

Figure 5:
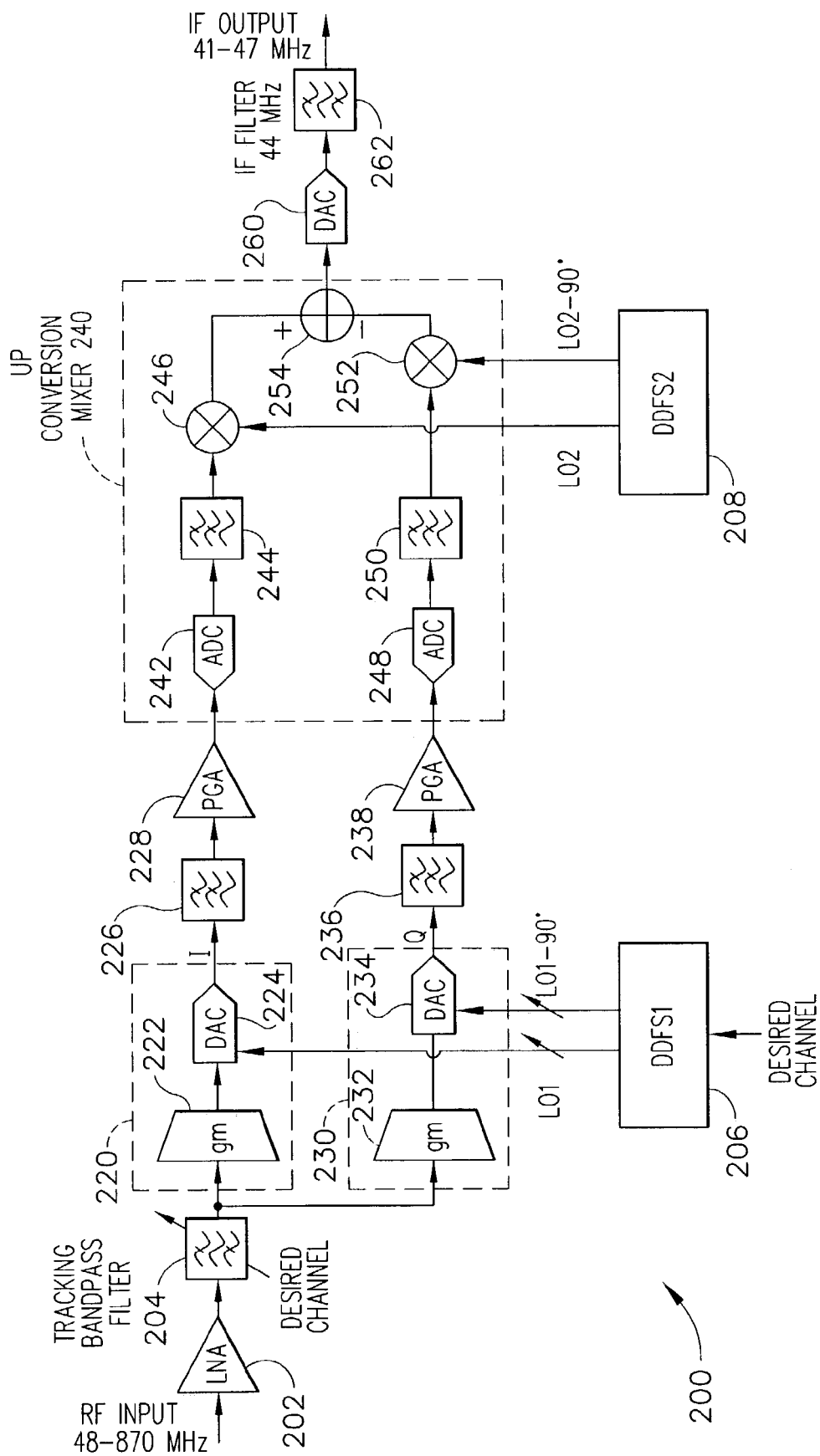
FIG. 5 illustrates in partial block diagram and partial schematic form an integrated television tuner according to the present invention.

FIG. 5 illustrates in partial block diagram and partial schematic form an integrated television tuner 200 according to the present invention. Tuner 200 includes generally an LNA 202, a tracking bandpass filter 204, a DDFS labeled "DDFS1" 206, a DDFS labeled "DDFS2" 208, a mixer 220, a lowpass filter 226, a PGA 228, a mixer 230, a lowpass filter 236, a PGA 238, an up conversion mixer 240, a DAC 260, and an IF filter 262. LNA 202 has an input terminal for receiving the RF INPUT signal, and an output terminal. Tracking bandpass filter 204 has an input terminal connected to the output terminal of LNA 202, a tuning input terminal for receiving the DESIRED CHANNEL signal, and an output terminal. DDFS 206 has an input for receiving the DESIRED CHANNEL signal, and output terminals for providing digital local oscillator signals labeled "LO1" and "LO1 -90°". DDFS 208 has output terminals for providing digital local oscillator signals labeled "LO2" and "LO2-90°".

Mixer 220 has a first input terminal connected to the output terminal of tracking bandpass filter 204, a second input terminal for receiving signal LO1, and an output terminal for providing an in-phase baseband signal labeled "I". Mixer 220 includes a transconductance amplifier 222 and a DAC 224. Transconductance amplifier 222 has an input terminal connected to the output terminal of filter 204, and an output terminal. DAC 224 has a first input terminal connected to the output terminal of transconductance amplifier 222, a second input terminal for receiving signal LO1, and an output terminal for providing signal I. Filter 226 has an input terminal connected to the output terminal of mixer 220, and an output terminal. PGA 228 has an input terminal connected to the output terminal of filter 226, and an output terminal.

Mixer 230 has a first input terminal connected to the output terminal of tracking bandpass filter 204, a second input terminal for receiving signal LO1-90°, and an output terminal for providing a quadrature baseband signal labeled "Q". Mixer 230 includes a transconductance amplifier 232 and a DAC 234. Transconductance amplifier 232 has an input terminal connected to the output terminal of filter 204, and an output terminal. DAC 234 has a first input terminal connected to the output terminal of transconductance amplifier 232, a second input terminal for receiving signal LO1-90°, and an output terminal for providing signal Q. Filter 236 has an input terminal connected to the output terminal of mixer 230, and an output terminal. PGA 238 has an input terminal connected to the output terminal of filter 236, and an output terminal.

Up conversion mixer 240 includes an analog-to-digital converter (ADC) 242, a lowpass filter 244, a mixer 246, an ADC 248, a lowpass filter 250, a mixer 252, and a summing device 254. ADC 242 has an input terminal connected to the output terminal of PGA 228, and an output terminal. Lowpass filter 244 has an input terminal connected to the output terminal of ADC 242, and an output terminal. Mixer 246 has a first input terminal connected to the output terminal of lowpass filter 244, a second input terminal for receiving signal LO2, and an output terminal. ADC 248 has an input terminal connected to the output terminal of PGA 238, and an output terminal. Lowpass filter 250 has an input terminal connected to the output terminal of ADC 248, and an output terminal. Mixer 252 has a first input terminal connected to the output terminal of lowpass filter 250, a second input terminal for receiving signal LO2-90°, and an output terminal. Summing device 254 has a positive input terminal connected to the output terminal of mixer 246, a negative input terminal connected to the output terminal of mixer 252, and an output terminal. DAC 260 has an input terminal connected to the output terminal of summing device 254, and an output terminal. IF filter 262 has an input terminal connected to the output terminal of DAC 260, and an output terminal for providing an output signal of tuner 200 labeled "IF OUTPUT".

Figure 1:
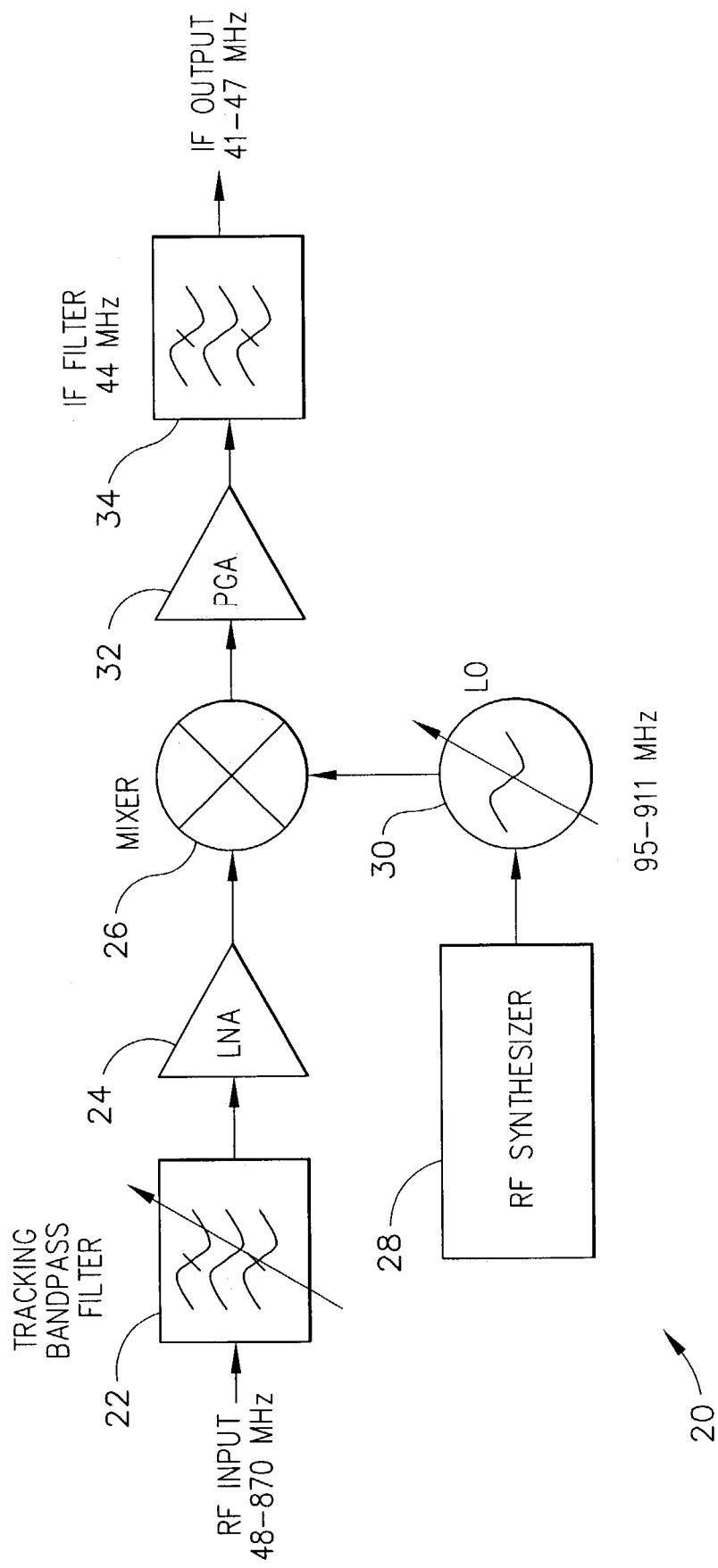
FIG. 1 illustrates in partial block diagram and partial schematic form a discrete television tuner known in the prior art.
Figure 2:
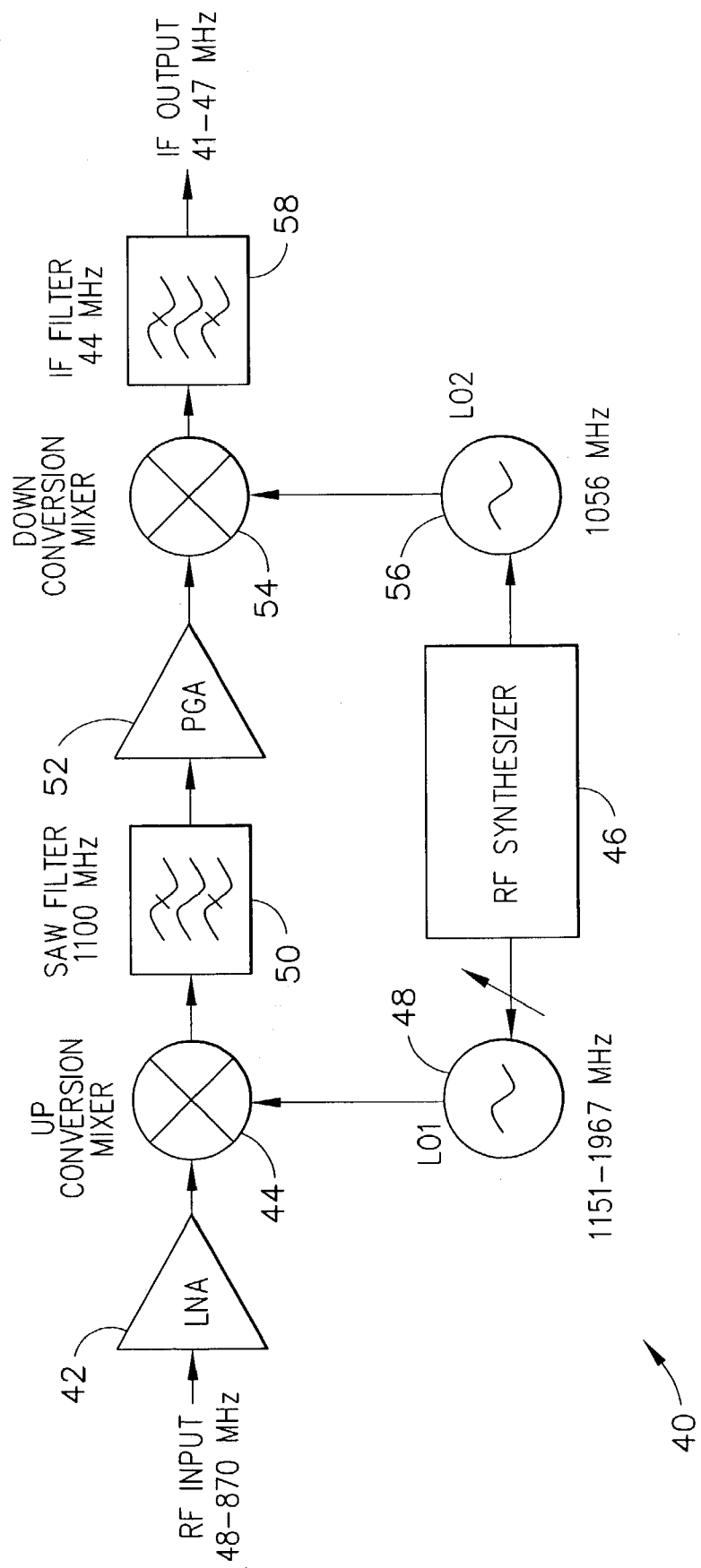
FIG. 2 illustrates in partial block diagram and partial schematic form an integrated television tuner known in the prior art.

In operation tuner 200 solves nearly all of the deficiencies of tuner 40 of FIG. 2 while being keeping the benefits of reduced manufacturing costs and stable performance of an integrated tuner. The RF INPUT signal is received from an antenna or cable source (not shown) and is provided to the input terminal of LNA 202. LNA 202 has a variable gain. The output of LNA 202 is input to tracking bandpass filter 204 whose center frequency is tunable based on the DESIRED CHANNEL input signal to reject undesired channels.

The tuned output signal, which includes the desired channel plus attenuated undesired channels, is mixed to baseband as follows. The output of filter 204 is converted into a current signal by highly linear transconductance amplifier 222. The current signal is then mixed in DAC 224, which functions as a current multiplying DAC using LO1 as a mixing signal, to provide the in-phase baseband signal I. Likewise the output of filter 204 is converted into a current signal by a separate highly linear transconductance amplifier 232, and is mixed in DAC 234 using a phase-shifted version of LO1, namely LO1-90°, as a mixing signal to develop the quadrature baseband signal Q. DDFS 206, transconductance amplifiers 222 and 232, and DACs 224 and 234 are implemented as described above with reference to FIGS. 3 and 4.

Depending on which channel is chosen as the DESIRED CHANNEL, DDFS 206 creates an appropriate sine wave to mix the desired channel down to baseband (i.e. DC). For example if the desired channel is centered at 500 MHz, DDFS 206 creates a 500 MHz sine wave for LO1 as well as a 90° shifted sine wave for LO1-90°. In an alternate embodiment LO1-270° could be used as the phase-shifted version of LO1 in which case the Q signal would be an inverted version of the Q signal as shown. Note that according to Nyquist's theorem DDFS 206 and current multiplying DACs 224 and 234 need to be clocked at greater than twice the highest frequency sine wave. Thus $F_{CLOCK}>2*870=1.740$ GHz and is preferably 2 GHz. The operation of the various circuits at those speeds is possible using currently-available CMOS or bipolar-CMOS (BICMOS) integrated circuit manufacturing technology.

The outputs of mixers 220 and 230 include the desired channel information spectrum and all other energy is filtered by filters 226 and 236. These outputs are then further processed at baseband. Filters 226 and 236 are anti-alias lowpass filters having a cutoff frequency of about 3 MHz. The outputs of filters 226 and 236 are amplified by PGAs 228 and 238 in order to increase the amplitude of small signals and to minimize the dynamic range required of ADCs 242 and 248 in up conversion mixer 240.

In up-conversion mixer 240 the clock rate of ADCs 242 and 248 is preferably below the frequency of any received signal (i.e., 48 MHz) to minimize interference created from the switching that gets reflected back into the analog signal, but is also as high as possible to minimize the order of filters 226 and 236. For use in a television receiver having an IF center frequency of 44 MHz, a clock rate of 40 MHz was chosen. Lowpass filters 244 and 250 provide additional attenuation for undesired channels and are implemented in the digital domain. In an alternative embodiment, up conversion mixer 240 could be implemented in the analog domain and in that case ADCs 242 and 248 would not be necessary. DDFS 208 is preferably clocked at 100 MHz to satisfy the Nyquist criterion for generating a 44 MHz mixing signal.

Even though a baseband digital signal can be used by most televisions available today with simple modifications, tuner 200 preferably provides the analog IF OUTPUT at a standard IF of 44 MHz, although any other desirable IF such as 38 MHz may be used as well. Thus it is necessary for tuner 200 to re-combine the baseband I and Q signals to reconstruct the full 6 MHz spectrum in the IF signal. Up conversion mixer 240 converts the filtered, gain-adjusted I and Q signals into the digital domain using ADCs 242 and 246. Conversion of these signals into the digital domain avoids generating local oscillator signals that can creates spurs or tones, allows a relaxation of the specifications of analog filters 226 and 236, and makes it easier to extract audio signals. Up conversion mixer 240 mixes the outputs of ADCs 242 and 246 (the digital I and Q signals) to IF using digital local oscillator signals LO2 and LO2-90° before combining them in summing device 254. The output of summing device 254 is converted back to analog using IF DAC 260 and filtered in IF filter 262 for driving off-chip. In other embodiments which interface to televisions at baseband, up conversion mixer 240, DAC 260, and IF filter 262 may be omitted.

Tuner 200 overcomes the problems associated with both the discrete LC tuners and integrated up/down converters by not using oscillators to generate LO1 and LO2 and their phase-shifted variants. DDFS 206 provides an ultra pure sine wave with very low phase noise and low spur. The digitized sine wave is widely tunable and is easily generated. Since there is no circuit node that contains an actual oscillator signal, as there would be with LC oscillators, there is no mechanism for the local oscillator signals to leak or radiate into other circuits, causing unwanted locking or spurs. Another advantage of using DACs 224 and 234 is that they allow for direct down conversion to DC in the first mixer. Direct down conversion is not normally possible with an LC oscillator because leakage of the local oscillator signal to the RF INPUT causes a situation where the local oscillator mixes with itself and produces an enormous DC offset with respect to the desired signal. Generation and use of a digital local oscillator signal as required by DACs 224 and 234 eliminate this problem. The first digital local oscillator signal, LO1, mixes the center of the desired channel to DC in the current multiplying DAC by controlling the orientation of the switches. Thus tuner 200 is suitable for integration onto a single silicon chip.

It should be apparent that a tuner using the architecture disclosed herein can be used in a wide variety of RF receiver applications, including television, cellular telephones, pagers, global positioning system (GPS) receivers, cable modems, cordless phones, and the like. The tuner may also use other transistor technologies besides CMOS. Also the type of encoding of the digital oscillator signal used within the DAC, such as binary weighted and thermometer encoded, may vary.

While an exemplary embodiment(s) has been presented in the foregoing detailed description of the invention, it should be appreciated that a vast number of variations exist. It should also be appreciated that these exemplary embodiments are only examples, and are not intended to limit the scope, applicability, or configuration of the invention in any way. Rather, the foregoing detailed description will provide those skilled in the art with a convenient road map for implementing a preferred embodiment of the invention. It being understood that various changes may be made in the function and arrangement of elements described in an exemplary preferred embodiment without departing from the spirit and scope of the invention as set forth in the appended claims.

I claim:

1. A tuner comprising:
a direct digital frequency synthesizer having output terminals for providing a digital local oscillator signal having a frequency chosen to mix a desired channel to baseband; and
a mixer having a first input terminal for receiving a radio frequency signal, second input terminals coupled to respective ones of said output terminals of said direct digital frequency synthesizer, and an output terminal for providing an in-phase analog baseband signal, wherein said digital local oscillator signal is a parallel multiple-bit digital signal and said radio frequency signal is an analog signal.

2. The tuner of claim 1 wherein said radio frequency signal is characterized as being a radio frequency television signal.

3. The tuner of claim 1 further comprising a tracking bandpass filter having an input terminal for receiving a radio frequency input signal, a tuning input terminal for receiving a tuning signal corresponding to said desired channel, and an output terminal for providing said radio frequency signal.

4. The tuner of claim 3 further comprising a low noise amplifier having an input terminal adapted to be coupled to a signal source, and an output terminal coupled to said input terminal of said tracking bandpass filter.

5. The tuner of claim 1 further comprising a lowpass filter having an input terminal coupled to said output terminal of said mixer, and an output terminal for providing a filtered baseband signal.

6. The tuner of claim 5 further comprising a programmable gain amplifier having an input terminal coupled to said output terminal of said lowpass filter, and an output terminal for providing a gain-adjusted baseband signal.

7. The tuner of claim 1 further comprising a second mixer having a first input terminal for receiving said radio frequency signal, a second input terminal, and an output terminal for providing a quadrature analog baseband signal, wherein said direct digital frequency synthesizer further has a second output terminal coupled to said second input terminal of said second mixer for providing for providing a phase-shifted digital local oscillator signal.

8. The tuner of claim 7 further comprising means for converting said in-phase analog baseband signal and said quadrature analog baseband signal to an output signal having a predetermined center frequency.

9. The tuner of claim 8 wherein said means for converting comprises an up conversion mixer having a first input terminal for receiving said in-phase analog baseband signal, a second input terminal for receiving said quadrature analog baseband signal, a third input terminal for receiving a second digital local oscillator signal having said predetermined center frequency, a fourth input terminal for receiving a phase-shifted second digital local oscillator signal, and an output terminal for providing said output signal.

10. The tuner of claim 9 further comprising a second direct digital frequency synthesizer having a first output terminal for providing said second digital local oscillator signal, and a second output terminal for providing said phase-shifted second digital local oscillator signal.

11. The tuner of claim 1 wherein said direct digital frequency synthesizer and said mixer are combined in a single integrated circuit.

12. A tuner comprising:
a first mixer having a first input terminal for receiving a radio frequency signal, second input terminals for receiving a first digital local oscillator signal having a frequency chosen to mix a desired channel to baseband, and an output terminal for providing an in-phase analog baseband signal;

a second mixer having a first input terminal for receiving said radio frequency signal, second input terminals for receiving a phase-shifted first digital local oscillator signal, and an output terminal for providing a quadrature analog baseband signal;

a first direct digital frequency synthesizer having first output terminals coupled to respective ones of said second input terminals of said first mixer for providing said first digital local oscillator signal, and second output terminals coupled to respective ones of said second input terminals of said second mixer for providing said phase-shifted first digital local oscillator signal, wherein said first digital local oscillator signal and said phase-shifted first digital local oscillator signal are parallel multiple-bit digital signals and said radio frequency signal is an analog signal;

means for processing at least one of said in-phase analog baseband signal and said quadrature analog baseband signal at baseband to provide a processed in-phase signal and a processed quadrature signal; and an up conversion mixer having a first input terminal for receiving said processed in-phase signal, a second input terminal for receiving said processed quadrature signal, a third input terminal for receiving a second digital local oscillator signal having a predetermined frequency, a fourth input terminal for receiving a phase-shifted second digital local oscillator signal, and an output terminal for providing a tuned intermediate frequency signal.

13. The tuner of claim 12 further comprising a second direct digital frequency synthesizer having a first output terminal for providing said second digital local oscillator signal, and a second output terminal for providing said phase-shifted second digital local oscillator signal.

14. The tuner of claim 12 wherein said means for processing comprises a lowpass filter.

15. The tuner of claim 12 wherein said means for processing comprises a programmable gain amplifier.

16. The tuner of claim 15 wherein said means for processing further comprises a lowpass filter.

17. The tuner of claim 12 further comprising a tracking bandpass filter having an input terminal for receiving a radio frequency input signal, a tuning input terminal for receiving a tuning signal corresponding to a desired channel, and an output terminal coupled to said first input terminals of said first and second mixers.

18. The tuner of claim 17 further comprising a low noise amplifier having an input terminal adapted to be coupled to a signal source, and an output terminal coupled to said input terminal of said tracking bandpass filter.

19. The tuner of claim 12 wherein said up conversion mixer comprises:

a first analog-to-digital converter having a first input terminal for receiving said processed in-phase signal, and an output terminal;

a first lowpass filter having an input terminal coupled to said output terminal of said first analog-to-digital converter, and an output terminal;

a third mixer having a first input terminal coupled to said output terminal of said first lowpass filter, a second input terminal for receiving said second digital local oscillator signal, and an output terminal;

a second analog-to-digital converter having a first input terminal for receiving said processed quadrature signal, and an output terminal;

a second lowpass filter having an input terminal coupled to said output terminal of said second analog-to-digital converter, and an output terminal;

a fourth mixer having a first input terminal coupled to said output terminal of said second lowpass filter, a second input terminal for receiving said phase-shifted second digital local oscillator signal, and an output terminal; and a summing device having a first input terminal coupled to said output terminal of said third mixer, a second input terminal coupled to said output terminal of said fourth mixer, and an output terminal for providing said tuned intermediate frequency signal.

20. The tuner of claim 12 further comprising:

a digital-to-analog converter having an input terminal coupled to said output terminal of said up conversion mixer, and an output terminal; and a bandpass filter having an input terminal coupled to said output terminal of said digital-to-analog converter, and an output terminal for providing an output signal of the tuner.

21. The tuner of claim 12 wherein said first mixer, said second mixer, said means for processing, and said up conversion mixer are combined in a single integrated circuit.

22. The tuner of claim 12 wherein said radio frequency signal is characterized as being a radio frequency television signal.

23. A method for tuning a signal comprising the steps of:

generating a digital local oscillator signal using a direct digital frequency synthesizer having a frequency chosen to mix a desired channel to baseband;

receiving a radio frequency signal; and mixing said radio frequency signal with said digital local oscillator signal to provide an in-phase analog baseband signal, wherein said digital local oscillator signal is a parallel multiple-bit digital signal and said radio frequency signal is an analog signal.

24. The method of claim 23 further comprising the step of:

filtering a radio frequency input signal received from a signal source to attenuate all frequencies outside a range corresponding to a desired channel to provide said radio frequency signal.

25. The method of claim 23 further comprising the step of: lowpass filtering said in-phase analog baseband signal to provide a filtered baseband signal.

26. The method of claim 23 further comprising the step of:

converting said in-phase analog baseband signal to an intermediate frequency.

27. The method of claim 23 further comprising the step of:

mixing said radio frequency signal with a phase-shifted digital local oscillator signal to provide a quadrature analog baseband signal.

28. The method of claim 27 further comprising the step of:

converting said in-phase baseband signal and said quadrature baseband signal to an intermediate frequency.

29. The method of claim 28 wherein said step of converting comprises the steps of:

converting said in-phase analog signal and said quadrature analog signal to corresponding digital signals;

lowpass filtering said corresponding digital signals to provide corresponding filtered digital signals;

mixing said corresponding filtered digital signals respectively with a second digital local oscillator signal and a phase-shifted second digital local oscillator signal to provide first and second mixed signals, said second digital local oscillator signals having a frequency chosen to mix said in-phase baseband signal and said quadrature baseband signal to said intermediate frequency;

summing said first and second mixed signals to provide a summed signal;

converting said first summed signal to an analog signal; and filtering said analog signal using a bandpass filter to provide an output signal.

30. The method of claim 23 wherein said step of receiving said radio frequency signal comprises the step of receiving a radio frequency television signal.

31. A method for tuning a signal comprising the steps of:

receiving a radio frequency signal;

mixing said radio frequency signal to baseband using a first digital local oscillator signal and a phase-shifted first digital local oscillator signal to form an in-phase analog baseband signal and a quadrature analog baseband signal, respectively;

generating said first digital local oscillator signal and said phase-shifted first digital local oscillator signal using a first direct digital frequency synthesizer, wherein said first digital local oscillator signal and said phase-shifted first digital local oscillator signal are parallel multiple-bit digital signals and said radio frequency signal is an analog signal;

processing at least one of said in-phase analog baseband signal and said quadrature analog baseband signal at baseband to form a processed in-phase signal and a processed quadrature signal;

mixing said processed in-phase signal and said processed quadrature signal to an intermediate frequency using a second digital local oscillator signal and a phase-shifted second digital local oscillator signal, respectively, to form first and second intermediate frequency signals; and combining said first and second intermediate frequency signals to form an intermediate frequency output signal.

32. The method of claim 31 further comprising the step of:

generating said second digital local oscillator signal and said phase-shifted second digital local oscillator signal using a second direct digital frequency synthesizer.

33. The method of claim 31 wherein said step of processing comprises the step of lowpass filtering.

34. The method of claim 31 wherein said step of processing comprises the step of amplifying.

35. The method of claim 34 wherein said step of processing further comprises the step of lowpass filtering.

36. The method of claim 31 further comprising the step of filtering a radio frequency input signal to attenuate all frequencies outside a range corresponding to a desired channel to provide said radio frequency signal.

37. The method of claim 31 wherein said step of receiving said radio frequency signal comprises the step of receiving a radio frequency television signal.

* * * * *